United States Patent
Yazawa (10) Patent No.: US 7,518,867 B2
(45) Date of Patent: Apr. 14, 2009

(54) ELECTRONIC DEVICE COOLING DEVICE AND ELECTRONIC DEVICE COOLING METHOD

(75) Inventor: Kazuaki Yazawa, Chiba (JP)

(73) Assignee: Sony Computer Entertainment Inc., Tokyo (JP)

( * ) Notice: Subject to any disclaimer, the term of this patent is extended or adjusted under 35 U.S.C. 154(b) by 0 days.

(21) Appl. No.: 10/587,379

(22) PCT Filed: Dec. 2, 2004

(86) PCT No.: PCT/JP2004/017921

§ 371 (c)(1),
(2), (4) Date: Oct. 23, 2006

(87) PCT Pub. No.: WO2005/078792

PCT Pub. Date: Aug. 25, 2005

(65) Prior Publication Data

US 2007/0103868 A1    May 10, 2007

(30) Foreign Application Priority Data

Feb. 16, 2004    (JP) .............................. 2004-038174

(51) Int. Cl.
*H05K 7/20*    (2006.01)

(52) U.S. Cl. .................... 361/699; 361/689; 361/690; 361/704; 257/713; 257/714; 174/15.1; 165/80.3; 165/80.4

(58) Field of Classification Search ......... 361/688–691, 361/694–695; 165/104.33, 908; 454/184; 700/299–300
See application file for complete search history.

(56) References Cited

U.S. PATENT DOCUMENTS

| 5,361,188 | A  | * | 11/1994 | Kondou et al. .............. 361/695 |
| 5,474,120 | A  | * | 12/1995 | Severson et al. ............ 165/296 |
| 5,731,542 | A  |   | 3/1998  | Limper Brenner et al. |
| 6,255,622 | B1 | * | 7/2001  | May et al. ................... 219/209 |
| 6,735,499 | B2 | * | 5/2004  | Ohki et al. .................. 700/299 |
| 6,901,317 | B2 | * | 5/2005  | Starner ....................... 700/299 |
| 6,904,968 | B2 | * | 6/2005  | Beitelmal et al. ........... 165/247 |
| 7,008,804 | B2 | * | 3/2006  | Song et al. .................... 438/14 |

(Continued)

FOREIGN PATENT DOCUMENTS

CN    501764    9/2002

(Continued)

OTHER PUBLICATIONS

International Search Report based on PCT/JP2004/017921, dated Mar. 8, 2005, 3 pgs.

(Continued)

*Primary Examiner*—Boris L Chervinsky
(74) *Attorney, Agent, or Firm*—Matthew B. Dernier, Esq.; Gibson & Dernier LLP (57) ABSTRACT

An electronic device includes a cooling apparatus having: a primary cooling unit which is disposed in close proximity with an electronic device so as to face a surface thereof; an auxiliary cooling unit which is disposed in close proximity with the electronic device so as to face a surface thereof; and a controller which drives at least one of the primary cooling unit and the auxiliary cooling unit so as to cool the electronic device.

7 Claims, 5 Drawing Sheets

U.S. PATENT DOCUMENTS

| | | | |
|---|---|---|---|
| 7,017,059 B2 * | 3/2006 | Law et al. | 713/322 |
| 7,167,778 B2 * | 1/2007 | Yazawa et al. | 700/300 |
| 7,334,418 B2 * | 2/2008 | Henry et al. | 62/186 |
| 2004/0019452 A1 * | 1/2004 | Song et al. | 702/130 |
| 2007/0153474 A1 * | 7/2007 | Andersen et al. | 361/691 |

FOREIGN PATENT DOCUMENTS

| | | |
|---|---|---|
| CN | 534378 | 5/2003 |
| JP | H3-42717 | 9/1991 |
| JP | 04-129255 | 4/1992 |
| JP | 07-143615 | 6/1995 |
| JP | 3048597 | 5/1998 |
| JP | 2000-252669 | 9/2000 |
| JP | 2002-344066 | 11/2002 |

OTHER PUBLICATIONS

Japanese Office Action based on Japanese Patent Application No. 2004-038174, dated Feb. 22, 2005, 3 pgs.

International Preliminary Report on Patentability, dated Sep. 19, 2006, 7 pgs, JP2004/017921.

Office Action to corresponding Taiwan Application No. 094101200, issued Sep. 6, 2006, 6 pages.

Office Action issued for Corresponding TW Patent Application TW094101200.

Chinese office Action for corresponding patent application 2004800417851.

* cited by examiner

ELECTRONIC DEVICE COOLING DEVICE AND ELECTRONIC DEVICE COOLING METHOD

TECHNICAL FIELD

The present invention relates to a technology for cooling an electronic device and, more particularly, to a technology for cooling the surface of an electronic device by coordinating multiple cooling units with different characteristics.

BACKGROUND TECHNOLOGY

Electronic devices such as central processing units (CPUs) and digital signal processors (DSPs) are comprised of various electronic components including active elements such as transistors and passive elements such as capacitors. Part of electric energy for driving the electronic components is converted into thermal energy and dissipated. Since the performance of electronic components normally depends on temperature, dissipated heat affects the electronic components and, in turn, the performance of the electronic device. Thus, technology for cooling an electronic device is extremely important to control an electronic device properly.

An example of technology for cooling an electronic device is air-cooling using an electric fan. In this method, an electric fan is provided to face the surface of an electronic device. Air taken in from an air inlet is blown to the surface of the electronic device by the electric fan. Air heated as a result of absorbing heat generated from the surface of the electronic device is discharged from an air outlet. Thus, the electronic device is cooled by removing the heat generated from the surface of the electronic device by using the electric fan.

A device called a heat sink for dissipating heat is also used commonly. A heat sink is usually designed to have a large heat dissipation surface in order to transfer heat from a heat source such as an electronic device to a cool fluid or air that surrounds the electronic device. Heat generated from an electronic device is conducted to a heat sink and dissipated through an extensive heat dissipation surface of the heat sink.

A cooling method using an electric fan and a heat sink in combination is generally used to cool a semiconductor chip.

Time response of an electric fan or a heat sink to temperature variation is generally slow compared to variation in the amount of heat generated in an electronic device. In other words, the related-art cooling method cannot efficiently cool an electronic device in the face of minute-by-minute variation in the amount of heat generated in an electronic device. This necessitates holding extra cooling capacity in reserve in order to maintain the reliability of an electronic device. One drawback of this approach consists in large power consumption and noise of an electric fan. Another drawback is that the volume 6f an electric fan has to be larger than is necessary.

SUMMARY OF THE INVENTION

A general purpose of the present invention in this background is to provide a technology for cooling an electronic device efficiently.

An electronic device cooling apparatus according to at least one embodiment comprises: a primary cooling unit which is disposed in close proximity with an electronic device so as to face a surface thereof; an auxiliary cooling unit which is disposed in close proximity with the electronic device so as to face a surface thereof; and a controller which drives at least one of the primary cooling unit and the auxiliary cooling unit so as to cool the electronic device. The primary cooling unit maybe based on a cooling mechanism different from that of the auxiliary cooling unit. For example, with regard to cooling time response, which is time response to temperature variation in a target of cooling, an auxiliary cooling unit based on a cooling mechanism with faster cooling time response than the primary cooling unit may be employed. Alternatively, the cooling capacity of the auxiliary cooling unit per unit time may be higher than that of the primary cooling unit. The primary cooling unit and the auxiliary cooling unit may be disposed in close proximity with different areas on the surface of an electronic device cooled.

Cooling time response may be defined as a time required for a cooling unit to lower the temperature of a target of cooling to an original temperature, subsequent to a stepwise increase in the temperature. A primary cooling unit is represented by a cooling means, such as an electric fan, which is provided with large cooling capacity but is slow in responding to time variation of heat. In contrast, an auxiliary cooling unit is represented by a cooling means, such as a cooling nozzle for emitting a coolant to a target of cooling, which may be low in cooling capacity but is fast in responding to time variation of heat. Heat generated on a constant basis in an electronic device is dealt with by the primary cooling unit and instantaneous heat generation is dealt with by the auxiliary cooling unit. This approach uses two types of cooling units that differ in properties, depending on whether heat from an electronic device is generated on a constant basis or generated instantaneously, thereby enabling efficient cooling. An electronic device may be a device produced by packaging a semiconductor circuit.

An electronic device cooling apparatus according to at least one embodiment comprises: a primary cooling unit which is disposed in close proximity with an electronic device so as to face a predetermined surface thereof; an auxiliary cooling unit which delivers a jet of coolant to the electronic device via a through hole provided in a substrate that faces a surface of the electronic device different from the predetermined surface; and a controller which drives at least one of the primary cooling unit and the auxiliary cooling unit so as to cool the electronic device. For example, the primary cooling unit may be disposed in close proximity with the front surface of the electronic device, and the substrate may be provided to face the back surface, so that the auxiliary cooling unit may deliver a jet of coolant through a hole provided in the substrate.

An electronic device cooling apparatus according to at least one embodiment comprises: a heat dissipating mechanism which is disposed in close proximity with an electronic device so as to face a predetermined surface thereof and which dissipates heat generated from the predetermined surface; an auxiliary cooling-unit which delivers a jet of coolant to the electronic device via a through hole provided in a substrate that faces a surface of the electronic device different from the predetermined surface; and a controller which drives the auxiliary cooling unit so as to cool the electronic device. For example, the heat dissipating mechanism may be provided in close proximity with the front surface of the electronic device, and the substrate is provided to face the back surface, so that the auxiliary cooling unit may deliver a jet of coolant via a through hole provided in the substrate.

Optional combinations of the aforementioned constituting elements, and implementations of the invention in the form of methods, apparatuses, systems, recording mediums and computer programs may also be practiced as additional modes of the present invention.

According to the present invention, an electronic device can be effectively cooled.

DETAILED DESCRIPTION OF THE INVENTION

Heat generated from the surface of an electronic device such as a CPU or a DSP represents thermal energy as converted from electric energy supplied to electronic components and wires connecting the electronic components and dissipated therefrom. The heat is not necessarily generated from the surface of the electronic device on a constant basis. The amount of heat generated may instantaneously increase depending on the process performed by the electronic device. Even if the amount of heat generated from the surface of the electronic device is close to its maximum, instantaneous heat generation may occur concurrently. One cooling method adapted to instantaneous heat generation is based on a jet cooling mechanism. Jet cooling cools a heat generating object such as an electronic device by spraying the object with a jet of coolant.

Jet cooling is known as a method capable of ensuring high local heat transfer efficiency. The method is effective to deal with a large amount of heat generated locally in, for example, a machining operation. It cools a heat generating object by spraying the object with a jet of coolant from a cooling nozzle. The term "coolant" refers to fluid such as air or liquid such as water for absorbing and dissipating heat generated from the surface of an electronic device. Heat transfer on a plane perpendicular to the flow of coolant delivered occurs concentrically around a jet axis point. The term "jet axis point" refers to a point on the surface of a cooled object intersecting with an axis of jet from the cooling nozzle.

Heat transfer coefficient $h_0[W/m^2K]$, occurring when the impinging radius is denoted by $r_0[m]$ and the thermal conductivity of a coolant is denoted by $\lambda_f[W/mk]$, is given by $$h_0 = \lambda_f Nu_0/r_0$$

where $Nu_0$ denotes an average Nusselt number at the impinging radius of $r_0$ [m], which is given by $$Nu_0 = 1.25 \cdot Pr^{0.45} \cdot Re^{0.45}$$

where Pr denotes a constant called Prandtl number, and Re denotes the Reynolds number. Re is given by the following expression.

$$Re = u_0 \cdot d_0/v$$

where $u_0$ [m/s] denotes a representative speed derived from dividing the volume of jet flow by the cross section of the outlet of the cooling nozzle. $d_0$ [m] denotes the diameter of the outlet, and $v[s/m^2]$ denotes the viscosity of the fluid.

Jet cooling achieves improved cooling effect in the neighborhood of a jet axis point. By disposing multiple cooling nozzles in close proximity with one another to cover a target of cooling, even more advanced cooling effect is achieved.

Figure 1:
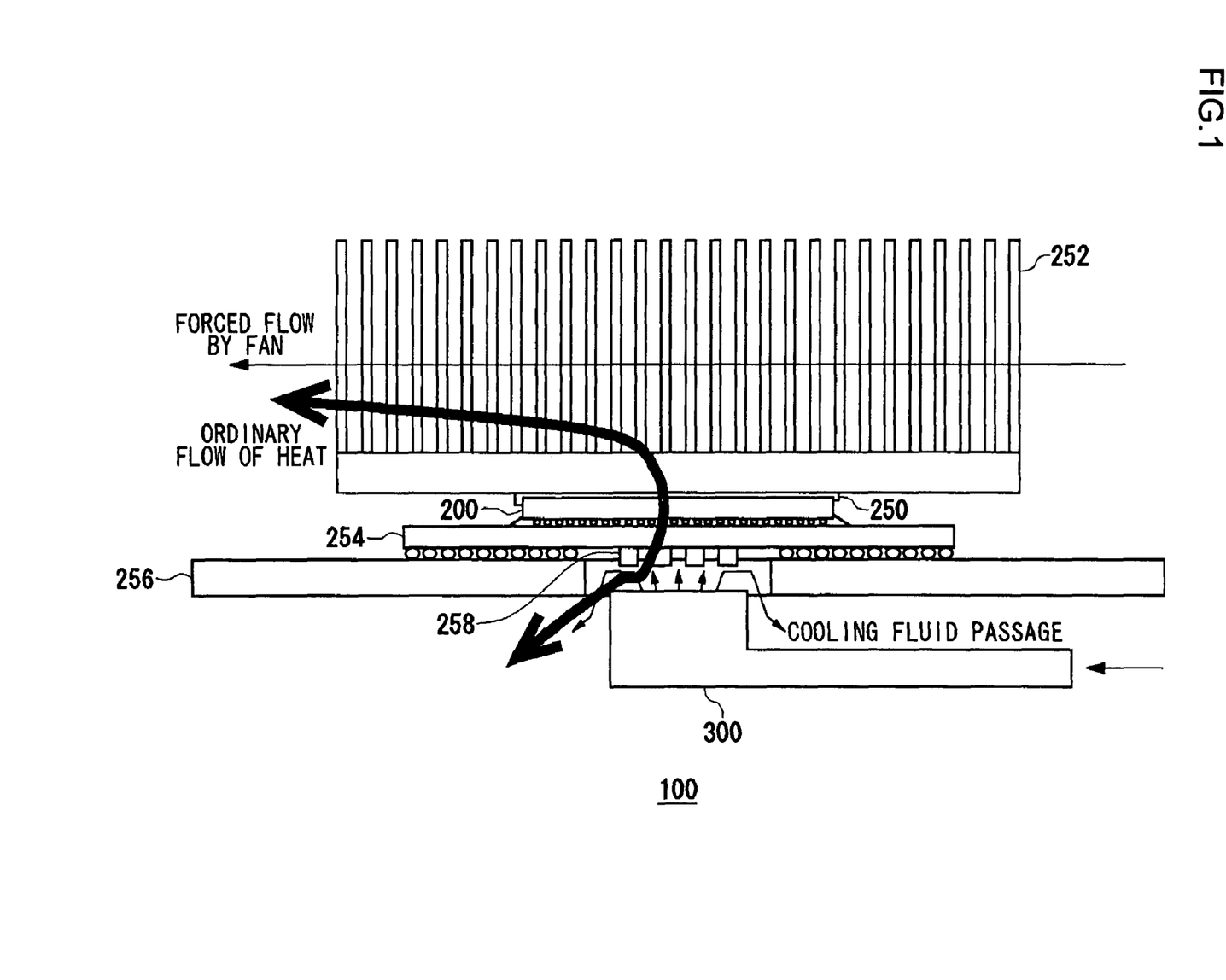
FIG. 1 is a schematic diagram showing the mechanism of an electronic device cooling apparatus.

FIG. 1 is a schematic diagram showing the mechanism of an electronic device cooling apparatus 100 according to an embodiment of the present invention. An electronic device 200 is a heat generating object and a target of cooling. A spreader 250 is fitted to the upper surface of the electronic device 200. Normally, the spreader 250 is formed of copper. A heat sink 252 is mounted on the spreader 250. Heat generated from the upper surface of the electronic device 200 is conducted to the heat sink 252 via the spreader 250. The heat sink 250 is provided with an extensive heat dissipation surface exposed to the environment. By blowing air from an electric fan (not shown) to the heat sink 252, heated air in the neighborhood of the heat dissipation surface of the heat sink 252 is efficiently removed. The electronic device 200 may be in direct contact with the heat sink 252.

The heat sink 252 may be exposed to cooling water. A waterproof case covers the surface of the electronic device 200. Cooling water is led to the heat sink 252. The cooling water is heated by absorbing heat generated by the electronic device 200 and conducted to the heat sink 252. The cooling water is then discharged through a cooling water outlet.

The electronic device 200 is mounted on a package substrate 254. The package substrate 254 serves as an intermediate plate for mounting the electronic device 200 on a mounting substrate 256. The mounting substrate 256 is attached to the package substrate 254 by solder. Normally, the distance between the package substrate 254 and the mounting substrate 256 is about 300-500 µm. Normally, several capacitors 258 are attached to the surface of the package substrate 254 facing the mounting substrate 256. In case the capacitance of the capacitors 258 is greater than a certain level, the capacitors 258 may be too large to fit in the clearance of about 300-500 µm. For this reason, the mounting substrate 256 is usually provided with an opening as shown immediately below the electronic device 200, in order to secure a height to provide the capacitors 258.

A jet cooling apparatus 300 sprays the package substrate 254 with a jet of coolant via the opening in an upward direction. The jet cooling apparatus 300 is provided with multiple coolant jet outlets. The delivering mechanism of the jet cooling apparatus 300 will be described later in detail. The jet of coolant delivered from the jet cooling apparatus 300 is collected by a coolant collecting hole (not shown). In case the coolant is a liquid, collection of the coolant warmed by the heat generated from the electronic device 200 may be achieved by capillary action as known in the art. Alternatively, the coolant may be collected actively by using a pump. The coolant collected is cooled by ambient air. The coolant is supplied again to the jet cooling apparatus 300. In case the coolant is air, the air may be wasted after delivering the jet.

The diameter of each of the coolant jet outlets is configured to be approximately ⅓ the distance between the upper surface of the jet cooling apparatus 300 and the package substrate 254. For example, if the distance is about 6 mm, the diameter of each of the coolant jet outlets is configured to be about 2 mm. The coolant jet outlets are arranged in a distributed manner, disposing the outlets both at the center and toward the edge of the jet cooling apparatus 300. If a location in the electronic device 200 which generates a relatively large amount of heat is identified beforehand, the diameter of each of the coolant jet outlets corresponding to the location may be configured to be larger than that of the other outlets. As demonstrated by the expression for jet cooling, the larger the diameter of the coolant jet outlet, the greater the heat transfer coefficient.

The jet cooling apparatus 300 may cool the surface of the package substrate 254 by directly spraying it with a coolant. Alternatively, the jet cooling apparatus 300 may indirectly cool the surface by spraying a case covering the surface of the package substrate 254. The effects intended by the present invention are achieved as long as the jet cooling apparatus 300 is configured to ensure the heat generated from the electronic device 200 is dissipated by jet cooling. For example, a mechanism similar to the jet cooling apparatus 300 may be provided inside the heat sink 252. More specifically, heat generated from the upper surface of the electronic device 200 on a constant basis may be removed by the heat sink 252 and an electric fan. Heat generated instantaneously may be removed by allowing the jet cooling apparatus 300 provided in the heat sink to spray the upper surface of the electronic device 200 with a coolant.

The opening provided in the mounting substrate 256 may not necessarily be provided at the center of the mounting substrate 256 as shown. For example, the opening may be provided to address the locality of heat generation in the electronic device 200. Alternatively, multiple openings may be provided. Further, multiple holes may be drilled through the mounting substrate 256 so that multiple locations of the package substrate 254 are sprayed with a coolant through the holes.

Multiple heat detection sensors are provided inside the electronic device 200 to detect the amount of heat it generates. The heat detection sensors may be provided on the electronic device 200 or the package substrate 254. The heat detection sensor may be a sensor, such as an infrared sensor, which detects the amount of generated heat by detecting infrared radiation from the surface of the electronic device 200. The heat detection sensor may be a thermometer for measuring the temperature inside the electronic device 200.

Normally, heat generated from the electronic device 200 is conducted to the heat sink 252 via the spreader 250 and released from the dissipation surface. If the amount of heat dissipated from the heat sink 252 is large, heat can be more efficiently removed by blowing air to the heat sink 252 using an electric fan. As a result, the electronic device 200 can be cooled more intensively. By controlling the rotational speed of the electric fan to be increased in accordance with the amount of heat generated from the electronic device 200, cooling adapted to the amount of generated heat is achieved. In the example described below, the heat sink 252 and the electric fan are used as cooling units of one type for cooling the electronic device 200.

Meanwhile, the electronic device 200 may generate the heat instantaneously. In the event of instantaneous heat generation, i.e., if the amount of heat generated rises abruptly per unit time, the jet cooling apparatus 300 is driven for cooling. The coolant is emitted by the jet cooling apparatus 300 toward the package substrate 254. Part of the heat generated from the electronic device 200 is conducted to the package substrate 254. By allowing the jet cooling apparatus 300 to deliver a jet of coolant, the package substrate 254 is cooled. As a result, heat conducted to the package substrate 254 is dissipated via the opening of the mounting substrate 256. If a location in the electronic device 200 which is heated to a relatively high temperature is known beforehand, the jet cooling apparatus 300 may be designed such that the coolant jet outlets of the jet cooling apparatus 300 are concentrated to cover the location. Jet cooling using a cooling nozzle allows heat, particularly the heat generated in the neighborhood of the jet axis, to be removed effectively. The larger the number of cooling nozzles and the higher the coolant delivering capability of the cooling nozzles, the higher the cooling effect.

Figure 2:
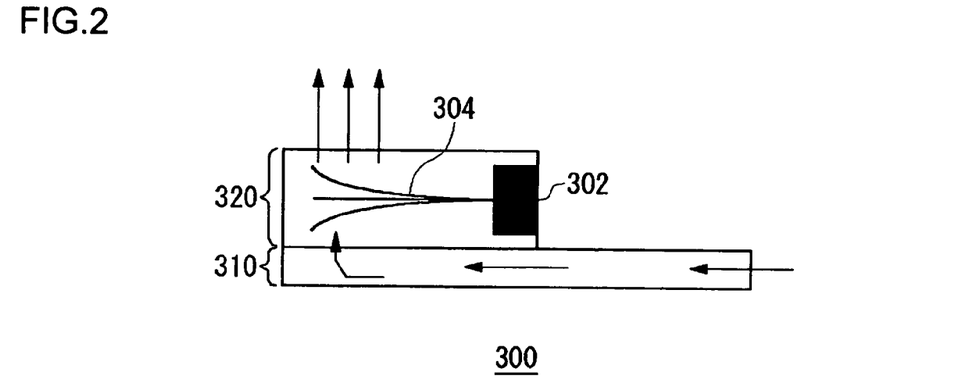
FIG. 2 shows a first example of the mechanism whereby a jet cooling apparatus delivers a jet of coolant.
Figure 3:
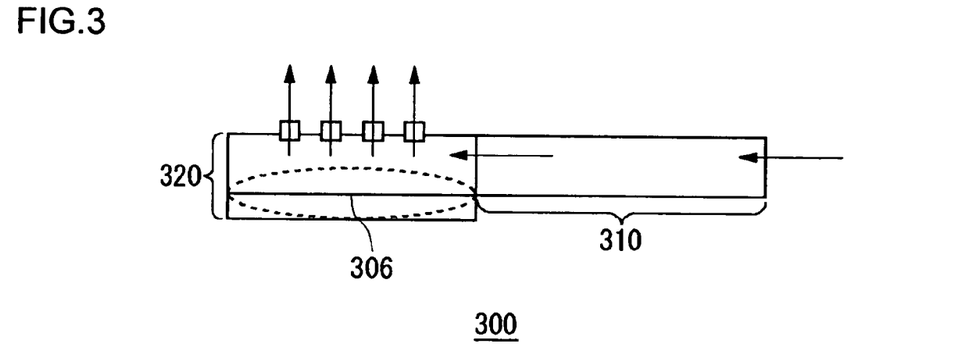
FIG. 3 shows a second example of the mechanism whereby the jet cooling apparatus delivers a jet of coolant.
Figure 4:
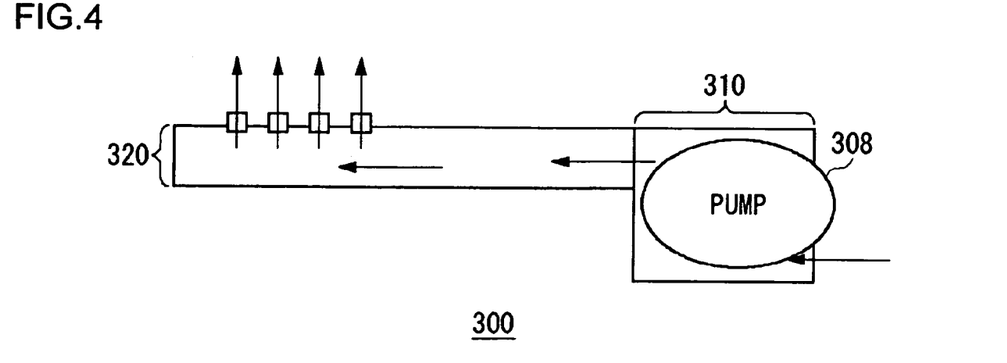
FIG. 4 shows a third example of the mechanism whereby the jet cooling apparatus delivers a jet of coolant.

FIGS. 2 through 4 show mechanisms whereby the jet cooling apparatus 300 delivers a jet of coolant.

FIG. 2 shows a first example of the mechanism whereby the jet cooling apparatus 300 delivers a jet of coolant. The jet cooling apparatus 300 includes a coolant passage 310 and a chamber 320. The coolant introduced into the coolant passage 310 is transferred to the chamber 320. The chamber 320 temporarily stores the coolant. Multiple coolant jet outlets are provided on the upper surface of the chamber 320. The coolant jet outlets function as cooling nozzles. A fan driver 302 comprises, for example, a piezoelectric element to drive a fan 304. When a predetermined voltage is applied to the fan driver 302, the fan driver 302 is deformed in accordance with the voltage value. The deformation is transferred to the fan 304 so that the fan 304 functions as a paper fan, so to speak, and delivers the coolant introduced into the chamber 320 through the coolant jet outlets on the upper surface of the chamber 320.

FIG. 3 shows a second example of the mechanism whereby the jet cooling apparatus 300 delivers a jet of coolant. In the illustrated example, too, the jet cooling apparatus 300 includes the coolant passage 310 and the chamber 320. The coolant introduced into the coolant passage 310 is transferred to the chamber 320. The chamber 320 temporarily stores the coolant. Multiple coolant jet outlets are provided on the upper surface of the chamber 320. The coolant jet outlets function as cooling nozzles. A driver (not shown) drives a movable film 306 by a force derived from, for example, electrostatic repulsion, piezoelectric effect or magnetism, in accordance with a control signal from an external source. The movable film 306 delivers a jet of coolant by pumping the coolant contained in the chamber 320 through the coolant jet outlets on the upper surface of the chamber 320.

FIG. 4 shows a third example of the mechanism whereby the jet cooling apparatus 300 delivers a jet of coolant. The jet cooling apparatus 300 includes the coolant passage 310 and the chamber 320. The coolant introduced into the coolant passage 310 is transferred to the chamber 320. The chamber 320 temporarily stores the coolant. Multiple coolant jet outlets are provided on the upper surface of the chamber 320. The coolant jet outlets function as cooling nozzles. The coolant passage 310 includes a pump 308. The pump 308 transfers the coolant introduced into the coolant passage 310 to the chamber 320. In this process, as the pump 308 pumps the coolant introduced into the coolant passage 310 into the chamber 320 at a high pressure, the coolant introduced into the chamber 320 is delivered through the coolant jet outlets on the upper surface of the chamber 320.

Figure 5:
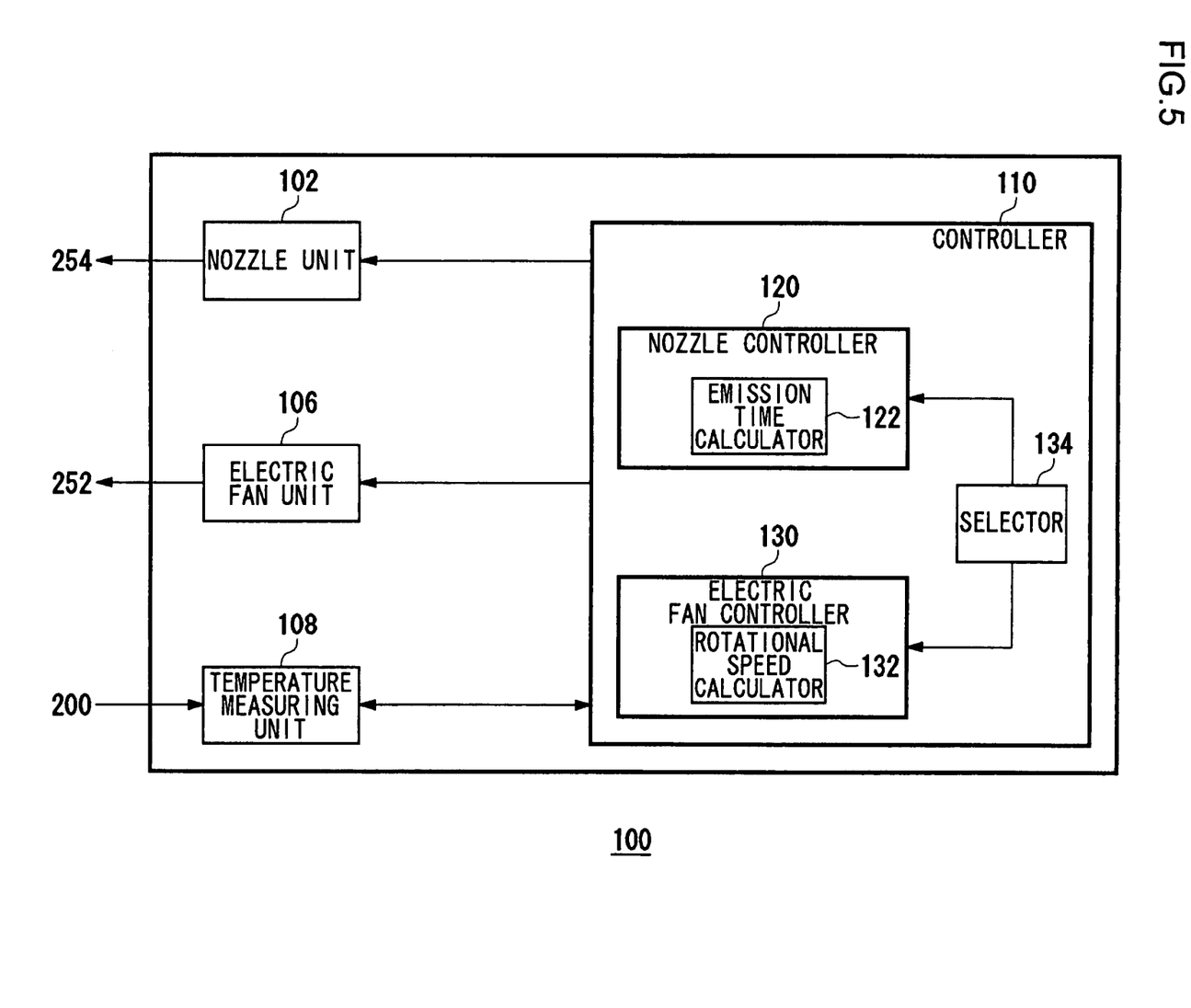
FIG. 5 is a functional block diagram of the electronic device cooling apparatus.

FIG. 5 is a functional block diagram of the electronic device cooling apparatus 100. The blocks as shown may be implemented hardware wise by elements such as a CPU of a computer or by a mechanism, and software wise by a computer program or the like. FIG. 5 depicts functional blocks implemented by cooperation of hardware and software. Therefore, it will be obvious to those skilled in the art that the functional blocks may be implemented in a variety of manners by a combination of hardware and software.

A controller 110 exercises overall control of the cooling mechanism of the electronic device cooling apparatus 100. A nozzle unit 102 is a mechanism for delivering a jet of coolant to the package substrate 254. The jet cooling mechanism 300 represents an example of the nozzle unit 102. An electric fan unit 106 is a mechanism for blowing air to the heat sink 252. The electric fan described with reference to FIG. 1 corresponds to the electric fan unit 106. A temperature measuring unit 108 measures the temperature of the electronic device 200 by referring to the heat value detected by a thermal sensor provided in the electronic device 200. The temperature measuring unit 108 also measures time variation of the temperature in the electronic device 200. The temperature measuring unit 108 may directly measure the temperature of the electronic device 200 by providing a thermometer inside the electronic device 200.

The controller 110 includes a nozzle controller 120, an electric fan controller 130 and a selector 134. The nozzle controller 120 controls the nozzle unit 102 by sending a control signal thereto. If, for example, the jet cooling apparatus 300 is of a structure described with reference to FIG. 2, the nozzle controller 120 controls the nozzle unit 102 by applying a predetermined voltage to the fan driver 302. The electric fan controller 130 controls the electric fan unit 106 by sending a control signal thereto. The nozzle controller 120 includes an emission time calculator 122, and the electric fan controller 130 includes a rotational speed calculator 132. The selector 134 directs one or both of the nozzle controller 120 and the electric fan controller 130 to exercise control, in accordance with the temperature characteristic of the electronic device 200 measured by the temperature measuring unit 108.

If the temperature of the electronic device 200 measured by the temperature measuring unit 108 exceeds a predetermined threshold value, the selector 134 detects it accordingly and sends a selection signal to the electric fan controller 130. The electric fan controller 130 sends a control signal to the electric fan unit 106 so as to drive the electric fan. The rotational speed calculator 132 calculates the number of revolutions of the electric fan in accordance with the temperature of the electronic device 200 measured by the temperature measuring unit 108. The number of revolutions may be the number of revolutions of the electric fan per unit time. Alternatively, the number of revolutions may be the total number of revolutions, i.e., drive time, of the electric fan. If the surface temperature of the electronic device 200 is high, the electric fan controller 130 directs the electric fan unit 106 to drive the electric fan at a high speed. Alternatively, the electric fan controller 130 directs the electric fan unit 106 to drive the electric fan for a longer period of time.

The temperature measuring unit 108 temporarily registers time-dependent change of the temperature measured. If a rise in the temperature of the electronic device 200 per unit time measured by the temperature measuring unit 108 exceeds a predetermined threshold value, the selector 134 reads the data and sends a selection signal to the nozzle controller 120. The nozzle controller 120 sends a control signal to the nozzle unit 102 so as to drive the jet cooling apparatus 300. The emission time calculator 122 calculates a period of time during which a jet of coolant should be delivered, in accordance with a rise in the temperature of the electronic device 200 per unit time. The emission time calculator 122 may calculate the speed of a jet of coolant or the quantity of coolant delivered, in accordance with a rise of the temperature of the electronic device 200 per unit time measured by the temperature measuring unit 108. To control the nozzle unit 102 to repeatedly deliver a jet of coolant, the emission time calculator 122 may calculate a ratio between time in which the jet cooling apparatus 300 delivers a jet of coolant and time in which it does not deliver a jet of coolant. The nozzle controller 120 causes the nozzle unit 102 to deliver a jet of coolant by sending a control signal thereto in accordance with the calculation by the emission time calculator 122.

The temperature measuring unit 108 may detect heat distribution in the electronic device 200 instead of the temperature of the electronic device 200 as a whole. The nozzle controller 120 may exercise control such that the coolant is delivered from those coolant jet outlets corresponding to the location in the electronic device 200 generating a large amount of heat. This can achieve effective cooling even in the event of localized heat generation in the electronic device 200 as well as instantaneous heat generation in the electronic device 200.

Figure 6:
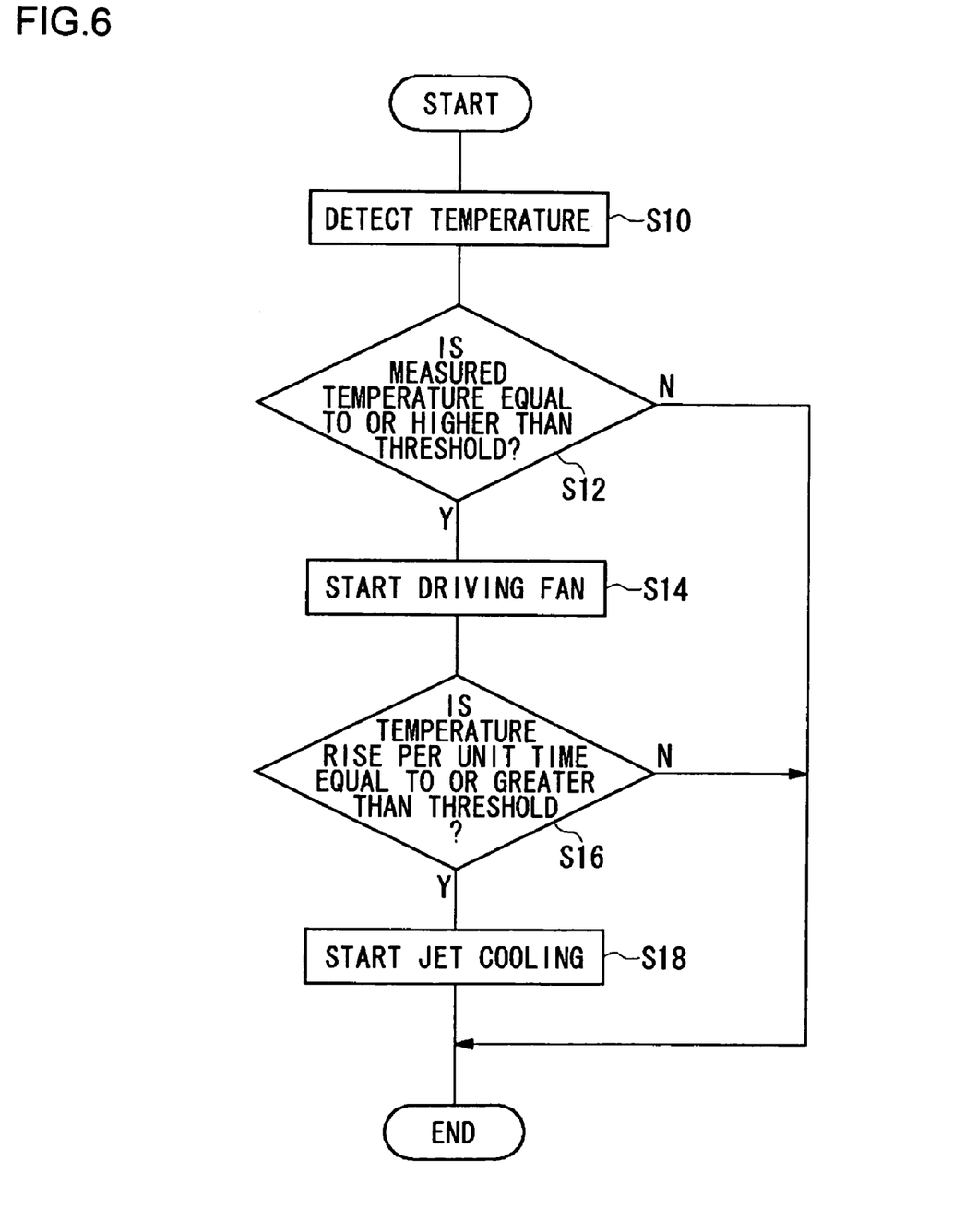
FIG. 6 is a flowchart showing a process whereby the electronic device cooling apparatus cools the electronic device.

FIG. 6 is a flowchart showing a process whereby the electronic device cooling apparatus 100 cools the electronic device 200. The temperature measuring unit 108 measures the temperature of the electronic device 200 by referring to the heat value detected by a thermal sensor embedded in the electronic device 200 (S10). The selector 134 determines whether the temperature of the electronic device 200 thus measured exceeds a threshold value (S12). The predetermined threshold value is arbitrarily set by a designer in accordance with the performance of the electronic device 200 or the environment in which it is used. Hereinafter, the threshold value will be referred to as a first threshold value. If the temperature measured is lower than the first threshold value (N in S12), the nozzle unit 102 and the electric fan 106 are not driven, whereupon the process is terminated. If the temperature measured is equal to or higher than the first threshold value (Y in S12), the selector 134 sends a selection signal to the electric fan controller 130. The electric fan controller 130 drives the electric fan unit 106 so as to drive the electric fan into rotation (S14).

The selector 134 determines whether a rise in the temperature of the electronic device 200 per unit time measured by the temperature measuring unit 108 exceeds a predetermined threshold value (S16). The predetermined threshold value is also a value set by a designer in accordance with the performance of the electronic device 200 or the environment in which it is used. Hereinafter, the threshold value will be referred to as a second threshold value. If the temperature rise per unit time measured is smaller than the second threshold value (N in S16), the process is terminated. If the temperature rise per unit time measured is equal to or greater than the second threshold value (Y in S16), the selector sends a selection signal to the nozzle controller 120. The nozzle controller 120 drives the nozzle unit 102 so as to deliver a jet of coolant (S18). The temperature measuring unit 108 detects the temperature on a regular basis so that steps S10 through S18 are repeated.

The nozzle unit 102 and the electric fan unit 106 may be driven concurrently. Even when the temperature of the electronic device 200 is lower than the first threshold value, the nozzle unit 102 may be driven if the rise in the temperature of the electronic device 200 per unit time is equal to or greater than the second threshold value. The nozzle unit 102 or the electric fan 106 may be controlled in accordance with the amount of heat generated in the electronic device 200 instead of the temperature.

Figure 7:
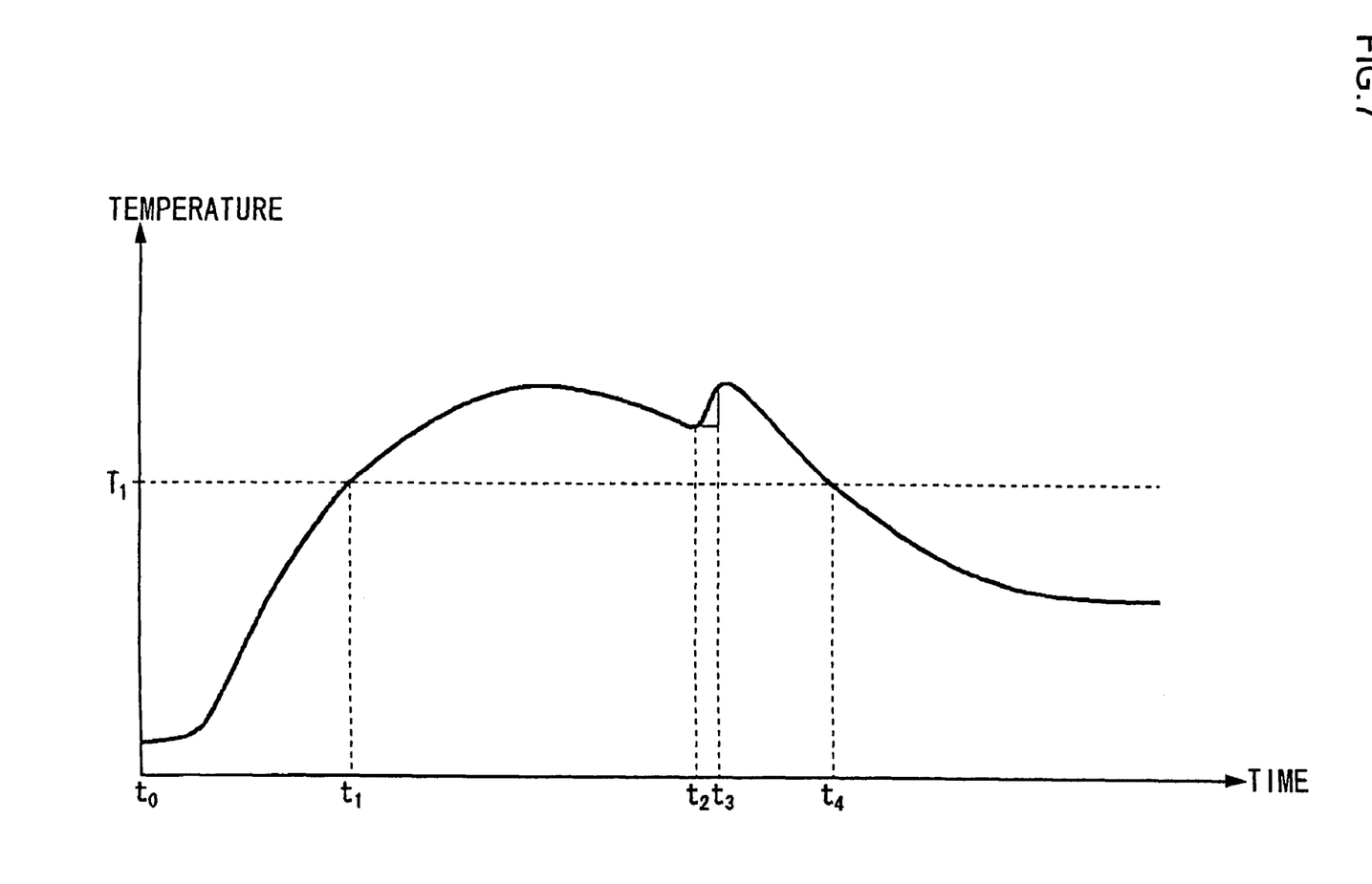
FIG. 7 is a graph showing a relation occurring in the electronic device cooling apparatus between time variation of the temperature and the control of the electronic device.

FIG. 7 is a graph showing a relation between time variation of the temperature of the electronic device 200 and the control of the electronic device cooling apparatus 100. In the graph, the horizontal axis represents elapsed time. It will be assumed that the electronic device 200 begins its process at time t0. The vertical axis represents the temperature of the surface of the electronic device 200. The temperature is measured by the temperature measuring unit 108 using the thermal sensor in the electronic device 200. T1 denotes the first threshold value mentioned above. A chronological description will be now given of the process of the electronic device cooling apparatus 100.

Time t1:

The temperature of the electronic device 200 rises and exceeds T1, the first threshold value. The selector 134 sends a selection signal to the electric fan controller 130. The electric fan controller 130 sends a control signal to the electric fan unit 106 so as to drive the electric fan. This mitigates the rise in the temperature in a period past time t1, causing the temperature to be lowered after a time.

Time t2:

The temperature of the electronic device 200 begins to rise instantaneously. At this stage, the temperature is still higher than T1 so that the electric fan continues to be driven. However, since the electric fan's cooling time response is slower than that of jet cooling, the temperature is not lowered immediately.

Time t3:

The selector 134 detects that a rise in the temperature per unit time in a period between t2 and t3 is equal to or greater than the second threshold value. The selector 134 sends a selection signal to the nozzle controller 120. The nozzle controller 120 sends a control signal to the nozzle unit 102 so as to drive the jet cooling apparatus 300. This mitigates the instantaneous temperature rise that occurred at time t2. When a rise in the temperature of the electronic device 200 per unit time is smaller than the second threshold value, jet cooling is terminated. At this stage, the temperature exceeds T1 so that the electric fan continues to be driven.

Time t4:

Since the temperature drops below T1 due to the cooling by the electric fan, the electric fan controller 130 sends a signal directing the electric fan unit 106 to stop driving the electric fan.

According to the described embodiment, heat generated from the electronic device 200 on a constant basis is removed by air cooling using the heat sink 252 and the electric fan. Meanwhile, heat generated from the electronic device 200 temporarily or instantaneously is removed by jet cooling. The electronic device cooling apparatus 100 according to the embodiment is capable of promptly responding to variation in the amount of heat generated from the electronic device 200, by driving a jet cooling mechanism as an auxiliary means.

Heat generated from the electronic device 200 on a constant basis is removed by the heat sink 252 and the electric fan and does not require driving the jet cooling apparatus 300. Even if the amount of heat generated from the surface of the electronic device is close to its maximum, instantaneous heat generation may occur concurrently. By performing jet cooling when the temperature of the electronic device rises in this manner, the electronic device 200 can be cooled effectively depending on the type of heat generation. Since the opening in the mounting substrate 256 is used in this embodiment, there is no need to provide an excessively large apparatus for jet cooling. This results in a reduced overall size of the electronic device cooling apparatus 100.

The technology used in the related-art air cooling and liquid cooling can be used unmodified in the system for supplying a coolant to the jet cooling apparatus 300 and the system for collecting the used coolant. The combination of an electric fan and jet cooling is described in the embodiment by way of example. The proposal of the present invention is to cool the electronic device 200 by driving cooling units based on cooling mechanisms that differ in respect of cooling time response. As such, the scope of the present invention is not limited to the cooling apparatus illustrated in the embodiment. For example, the heat sink 252 may be cooled by cooling water instead of an electric fan. Alternatively, the cooling mechanism facing the upper surface of the electronic device 200 may be implemented only by the heat sink 252, i.e., only by the heat dissipating mechanism. Similarly, the cooling mechanism with fast cooling time response may not be limited to jet cooling by the jet cooling apparatus 300. For example, heat may be removed from the package substrate 254 by water cooling using cooling water. Alternatively, a thermoelectric element may be used for cooling. It will be understood to persons skilled in the art that there are a variety of cooling methods based upon respective cooling mechanisms that differ in respect of cooling time response.

The description of the invention given above is based upon one illustrative embodiment. While the preferred embodiments of the present invention have been described using specific terms, such description is for illustrative purposes only, and it is to be understood that changes and variations may be made without departing from the spirit or scope of the appended claims. The described method cools an electronic device by coordinating two types of cooling units based upon different cooling mechanisms. Alternatively, more than two cooling units may be used. It will be understood to persons skilled in the art that a cooling unit may be designed in a variety of manners in accordance with the condition in which the electronic device is installed or the environment in which it is used.

The invention claimed is:

1. An electronic device cooling apparatus comprising:
  a primary cooling unit which is disposed so as to face a surface of an electronic device;
  an auxiliary cooling unit which is disposed so as to face another surface of the electronic device different from the surface that the primary cooling unit faces; and
  a controller which is operable to drive the primary cooling unit and the auxiliary cooling unit and drives at least one of the primary cooling unit and the auxiliary cooling unit based on how heat is generated from the electronic device so as to cool the electronic device, wherein
  the primary cooling unit is based on a cooling mechanism different from that of the auxiliary cooling unit.

2. The electronic device cooling apparatus according to claim 1, wherein the cooling capacity of the auxiliary cooling unit per unit time is higher than that of the primary cooling unit.

3. The electronic device cooling apparatus according to claim 1, wherein the auxiliary cooling unit is provided with a cooling nozzle, and
  the controller controls a coolant introduced in the cooling nozzle and drives the auxiliary cooling unit by delivering a jet of coolant from the cooling nozzle.

4. The electronic device cooling apparatus according to claim 1, further comprising a temperature measuring unit which measures the temperature of a surface of the electronic device, wherein
  when a rise in the measured temperature per unit time exceeds a predetermined threshold value, the controller drives the auxiliary cooling unit to cool the electronic device.

5. An electronic device cooling apparatus comprising:
  a primary cooling unit which is disposed so as to face a predetermined surface of an electronic device;
  an auxiliary cooling unit which delivers a jet of coolant to the electronic device via a through hole provided in a substrate that faces another surface of the electronic device different from the predetermined surface; and a controller which is operable to drive the primary cooling unit and the auxiliary cooling unit and drives at least one of the primary cooling unit and the auxiliary cooling unit based on how heat is generated from the electronic device so as to cool the electronic device.

6. An electronic device cooling method comprising:

measuring the temperature of a surface of an electronic device;

determining whether the measured temperature exceeds a first predetermined threshold value;

cooling the surface of the electronic device by a first cooling unit when the measured temperature exceeds the first predetermined threshold value;

determining whether a rise in the temperature of the surface of the electronic device per unit time exceeds a second predetermined threshold value as a result of time variation; and cooling the surface of the electronic device by a second cooling unit when the rise exceeds the second predetermined threshold value, wherein the first cooling unit is based on a cooling mechanism different from that of the second cooling unit.

7. A computer readable recording medium having embodied thereon a computer program product for controlling the cooling of an electronic device, the computer program product comprising:

a measuring module which measures the temperature of a surface of the electronic device;

a first determining module which determines whether the measured temperature exceeds a first predetermined threshold value;

a first cooling module which causes a first cooling unit to cool the surface of the electronic device when the measured temperature exceeds the first predetermined threshold value;

a second determining module which determines whether a rise in the temperature of the surface of the electronic device per unit time exceeds a second predetermined threshold value as a result of time variation; and a second cooling module which causes a second cooling unit to cool the surface of the electronic device when the rise exceeds the second predetermined threshold value, wherein the first cooling unit is based on a cooling mechanism different from that of the second cooling unit.

* * * * *